United States Patent
Yip et al.

(10) Patent No.: US 7,821,360 B2
(45) Date of Patent: Oct. 26, 2010

(54) MULTI-CHANNEL SURFACE ACOUSTIC WAVE FILTER DEVICE WITH VOLTAGE CONTROLLED TUNABLE FREQUENCY RESPONSE

(75) Inventors: David Yip, La Mirada, CA (US); Alvin Kong, Manhattan Beach, CA (US); Thomas Jung, Rolling Hills Estates, CA (US)

(73) Assignee: Northrop Grumman Systems Corporation, Los Angeles, CA (US)

(*) Notice: Subject to any disclaimer, the term of this patent is extended or adjusted under 35 U.S.C. 154(b) by 205 days.

(21) Appl. No.: 12/199,972

(22) Filed: Aug. 28, 2008

(65) Prior Publication Data

US 2010/0052818 A1    Mar. 4, 2010

(51) Int. Cl.
    *H03H 9/64* (2006.01)
(52) U.S. Cl. .................... 333/193; 310/313 B
(58) Field of Classification Search ......... 333/193–196; 310/313 R, 313 B, 313 C, 313 D
    See application file for complete search history.

(56) References Cited

U.S. PATENT DOCUMENTS

| | | | |
|---|---|---|---|
| 3,827,002 A * | 7/1974 | Chao ........................ | 333/193 |
| 4,298,849 A | 11/1981 | Arneson | |
| 4,354,166 A * | 10/1982 | Grudkowski ............ | 331/107 A |
| 4,401,956 A * | 8/1983 | Joshi ........................ | 333/152 |
| 4,636,678 A * | 1/1987 | Ballato .................... | 310/313 R |
| 4,746,882 A | 5/1988 | Solie | |
| 4,764,701 A | 8/1988 | Garbacz et al. | |
| 4,908,542 A | 3/1990 | Solie | |
| 5,770,985 A | 6/1998 | Ushiroku et al. | |
| 5,831,492 A | 11/1998 | Solie | |
| 6,023,122 A | 2/2000 | Liu et al. | |
| 6,057,744 A | 5/2000 | Ikada | |

(Continued)

FOREIGN PATENT DOCUMENTS

JP    A-57-062615    4/1982

(Continued)

OTHER PUBLICATIONS

T. Kodama, et al., "Design of Low-Loss SAW Filters Employing Distributed Acoustic Reflection Transducers," 1986 Ultrasonics Symposium, pp. 59-64.

(Continued)

*Primary Examiner*—Barbara Summons
(74) *Attorney, Agent, or Firm*—Posz Law Group, PLC

(57) ABSTRACT

A multi-channel surface acoustic wave (SAW) filter includes a voltage controlled velocity tunable piezoelectric substrate, an input transducer fabricated on the substrate, and an output transducer fabricated on the substrate. The input transducer further includes multiple input sub-transducers that are electrically and physically connected in parallel. The output transducer further includes multiple output sub-transducers that are electrically and physically connected in parallel. Corresponding pairs of input sub-transducers and output sub-transducers form multiple parallel channels for SAW propagation. The input transducer produces a voltage controlled tunable COMB frequency response that is combined with a voltage controlled tunable COMB frequency response produced by the output transducer to produce a SAW filter voltage controlled tunable frequency response. Further embodiments include a multi-channel SAW resonator, a SAW filter device connecting two novel SAW filters in series, and a SAW filter device connecting two novel SAW resonators in series.

18 Claims, 10 Drawing Sheets

U.S. PATENT DOCUMENTS

| | | | |
|---|---|---|---|
| 6,380,828 B1 * | 4/2002 | Liu et al. | 333/193 |
| 6,816,036 B2 | 11/2004 | Takamine | |
| 6,856,214 B2 * | 2/2005 | Jian et al. | 333/154 |
| 6,992,547 B2 | 1/2006 | Bergmann | |
| 7,190,242 B2 | 3/2007 | Takamine | |
| 7,656,253 B2 * | 2/2010 | Stokes et al. | 333/193 |
| 7,687,971 B2 * | 3/2010 | Stokes et al. | 310/313 B |
| 2003/0117039 A1 | 6/2003 | Tsutsumi et al. | |
| 2003/0168932 A1 | 9/2003 | Shibata et al. | |
| 2008/0042517 A1 | 2/2008 | Stokes et al. | |

FOREIGN PATENT DOCUMENTS

| | | |
|---|---|---|
| JP | A-2002-299997 | 10/2002 |
| JP | A-2003-060476 | 2/2003 |
| JP | A-2003-249842 | 9/2003 |

OTHER PUBLICATIONS

P.S. Cross and R.V. Schmidt, "Coupled Surface-Acoustic-Wave Resonators," The Bell System Technical Journal, vol. 56, No. 8, Oct. 1977, pp. 1447-1482.

C.K. Campbell et al, "Wide-Band Linear Phase SAW Filter Design Using Slanted Transducer Fingers," IEEE Transactions On Sonics and Ultrasonics, vol. SU-29, No. 6, Jul. 1982, pp. 224-228.

* cited by examiner

— INPUT TRANSDUCER
— OUTPUT TRANSDUCER

MULTI-CHANNEL SURFACE ACOUSTIC WAVE FILTER DEVICE WITH VOLTAGE CONTROLLED TUNABLE FREQUENCY RESPONSE

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Government Contract Number N00014-07-C-0216. This is a restricted contract so the government entity is not known.

TECHNICAL FIELD

Exemplary embodiments described herein relate generally to surface acoustic wave (SAW) filter devices, and specifically to multi-channel SAW filter devices with voltage controlled tunable frequency responses.

BACKGROUND

Conventional SAW filters utilize a single input interdigital transducer and a single output interdigital transducer formed on the surface of a piezoelectric substrate. The input transducer converts an input electrical signal to a SAW, and the SAW propagates along the surface of the substrate to the output transducer. The output transducer then converts the SAW back into an output electrical signal. The input transducer and the output transducer thus form a SAW filter characterized by a single channel across which the SAW propagates, from the input transducer to the output transducer. However, such a SAW filter has very limited frequency tuning range, and the frequency response shape is relatively fixed.

One improvement over the conventional SAW filters is to fabricate a SAW filter producing a COMB frequency response (which as used in this description and in the claims, a COMB frequency response or a COMB response indicating, as is known to those of ordinary skill in the art, a frequency response that consists of a series of spikes that gives the appearance of a hair comb) on a voltage controlled velocity tunable piezoelectric substrate. The input and output transducer fingers of the SAW filter are periodically withdrawn to create a COMB frequency response respectively. Varying the electric field across each transducer varies the SAW propagation velocity in each transducer, thus creating relative shifts of the frequency peaks in each COMB response. Cascading the input and output COMB responses of the input and output transducers results in cancellations of the input and output peaks at offset frequencies and enhancements of the input and output peaks at the same frequency. A single frequency peak response can be scanned across the operating frequency range by strategically biasing the input and output transducers.

A SAW filter producing a COMB frequency response fabricated on a voltage controlled velocity tunable substrate can multiply the tuning range. However, this approach results in crude filter properties in terms of filter rejection, insertion loss, and fixed pass band shape.

SUMMARY

In view of the above limitations of conventional and even more recent filter designs, exemplary multi-channel tunable filters covering much wider frequency ranges using novel SAW filter devices are described herein. Tunable filter shape is additionally obtained, including flat passband tops, steep rejection skirts, and good sidelobe suppression.

A first exemplary embodiment described herein is a multi-channel surface acoustic wave (SAW) filter, comprising: a voltage controlled velocity tunable piezoelectric substrate; an input transducer fabricated on the substrate and including a plurality of input sub-transducers electrically and physically connected in parallel to produce an input transducer voltage controlled tunable COMB frequency response, each input-sub-transducer having a unique voltage controlled tunable center frequency; an output transducer fabricated on the substrate and including a plurality of output sub-transducers electrically and physically connected in parallel to produce an output transducer voltage controlled tunable COMB frequency response, each output sub-transducer having a unique voltage controlled tunable center frequency; and a plurality of parallel channels formed by corresponding pairs of the plurality of input sub-transducers and the plurality of output sub-transducers, wherein the input transducer voltage controlled tunable COMB frequency response and output transducer voltage controlled tunable COMB frequency response are combined to produce an associated SAW filter voltage controlled tunable frequency response.

A second exemplary embodiment described herein is a multi-channel surface acoustic wave (SAW) resonator, comprising: at least one voltage controlled velocity tunable piezoelectric substrate; an input resonator fabricated on one of the at least one voltage controlled velocity tunable piezoelectric substrate including a plurality of input sub-resonators electrically and physically connected in parallel to produce an input resonator voltage controlled tunable COMB frequency response, each of the input sub-resonators including an input transducer, an output transducer, and a reflection grating structure, and having a frequency response with a unique voltage controlled tunable center frequency; an output resonator fabricated on one of the at least one voltage controlled velocity tunable piezoelectric substrate including a plurality of output sub-resonators electrically and physically connected in parallel to produce an output resonator voltage controlled tunable COMB frequency response, each of the output sub-resonators including an input transducer, an output transducer, and a reflection grating structure, and having a frequency response with a unique voltage controlled tunable center frequency, wherein the input resonator and output resonator are electrically connected in series, and the input resonator voltage controlled tunable COMB frequency response and output resonator voltage controlled tunable COMB frequency response are combined to produce an associated SAW resonator voltage controlled tunable frequency response.

A third exemplary embodiment described herein is a surface acoustic wave (SAW) filter device, comprising: a voltage controlled velocity tunable piezoelectric substrate; a first SAW filter, including: a first input transducer fabricated on the substrate and including a plurality of first input sub-transducers electrically and physically connected in parallel to produce a first input transducer voltage controlled tunable COMB frequency response, each first input sub-transducer having a unique voltage controlled tunable center frequency; a first output transducer fabricated on the substrate and including a plurality of first output sub-transducers electrically and physically connected in parallel to produce a first output transducer voltage controlled tunable COMB frequency response, each first output sub-transducer having a unique voltage controlled tunable center frequency; and a plurality of first parallel channels formed by corresponding pairs of the plurality of first input sub-transducers and the plurality of first output sub-transducers, wherein the first input transducer voltage controlled tunable COMB frequency response and first output transducer voltage controlled tunable COMB frequency response are combined to produce an associated first SAW filter voltage controlled tunable frequency response; and a second SAW filter electrically connected in series to the first SAW filter and including: a second input transducer fabricated on the substrate and including a plurality of second input sub-transducers electrically and physically connected in parallel to produce a second input transducer voltage controlled tunable COMB frequency response, each second input sub-transducer having a unique voltage controlled tunable center frequency; a second output transducer fabricated on the substrate and including a plurality of second output sub-transducers electrically and physically connected in parallel to produce a second output transducer voltage controlled tunable COMB frequency response, each second output sub-transducer having a unique voltage controlled tunable center frequency; and a plurality of second parallel channels formed by corresponding pairs of the plurality of second input sub-transducers and the plurality of second output sub-transducers, wherein the second input transducer voltage controlled tunable COMB frequency response and second output transducer voltage controlled tunable COMB frequency response are combined to produce an associated second SAW filter voltage controlled tunable frequency response, and the first SAW filter voltage controlled tunable frequency response and the second SAW filter voltage controlled are cascaded to produce an overall SAW filter voltage controlled tunable frequency response.

A fourth exemplary embodiment described herein is a surface acoustic wave (SAW) filter device, comprising: at least one voltage controlled velocity tunable piezoelectric substrate; a first SAW resonator, comprising: a first input resonator fabricated on one of the at least one voltage controlled velocity tunable piezoelectric substrate including a plurality of first input sub-resonators electrically and physically connected in parallel to produce a first input resonator voltage controlled tunable COMB frequency response, each of the first input sub-resonators including an input transducer, an output transducer, and a reflection grating structure, and having a frequency response with a unique voltage controlled tunable center frequency; a first output resonator fabricated on one of the at least one voltage controlled velocity tunable piezoelectric substrate including a plurality of first output sub-resonators electrically and physically connected in parallel to produce a first output resonator voltage controlled tunable COMB frequency response, each of the first output sub-resonators including an input transducer, an output transducer, and a reflection grating structure, and having a frequency response with a unique voltage controlled tunable center frequency; wherein the first input resonator and the first output resonator are electrically connected in series, and the first input resonator voltage controlled tunable COMB frequency response and the first output resonator voltage controlled tunable COMB frequency response are combined to produce a first SAW resonator voltage controlled tunable frequency response; a second SAW resonator electrically connected in series to the first SAW resonator and including: a second input resonator fabricated on one of the at least one voltage controlled velocity tunable piezoelectric substrate including a plurality of second input sub-resonators electrically and physically connected in parallel to produce a second input resonator voltage controlled tunable COMB frequency response, each of the second input sub-resonators including an input transducer, an output transducer, and a reflection grating structure, and having a frequency response with a unique voltage controlled tunable center frequency; a second output resonator fabricated on one of the at least one voltage controlled velocity tunable piezoelectric substrate including a plurality of second output sub-resonators electrically and physically connected in parallel to produce a second output resonator voltage controlled tunable COMB frequency response, each of the second output sub-resonators including an input transducer, an output transducer, and a reflection grating structure, and having a frequency response with a unique voltage controlled tunable center frequency; wherein the second input resonator and the second output resonator are electrically connected in series, the second input resonator voltage controlled tunable COMB frequency response and the second output resonator voltage controlled tunable COMB frequency response are combined to produce a second SAW resonator voltage controlled tunable frequency response, and the first SAW resonator voltage controlled tunable frequency response and the second SAW resonator voltage controlled tunable frequency response are cascaded to produce an overall SAW resonator voltage controlled tunable frequency response.

BRIEF DESCRIPTION OF THE DRAWINGS

Additional objectives and advantages of the exemplary embodiments will be more readily apparent from the following detailed description of preferred embodiments thereof, when taken together with the accompanying drawings in which.

DETAILED DESCRIPTION

Figure 1:
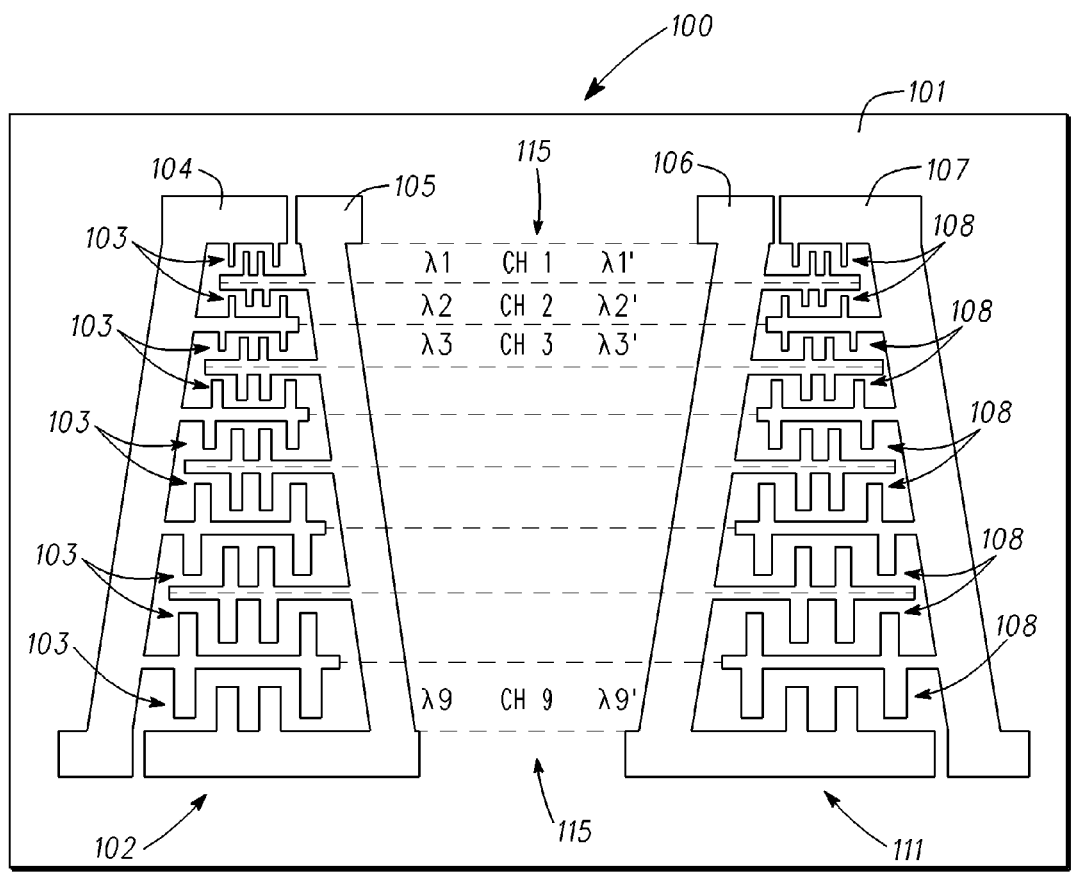
FIG. 1 is a plan view of a multi-channel SAW filter according to an exemplary embodiment.

Exemplary embodiments of novel SAW filters, SAW resonators, and SAW filter devices are now detailed. For ease of explanation, reference numerals to like components illustrated in multiple figures are not necessarily shown or described. In addition, it should be understood that use of relational terms such as first and second, input and output, and the like, are used solely to distinguish one from another entity, item, or action without necessarily requiring or implying any actual relationship or order between such entities, items, or actions. It should also be noted that should an embodiment include a plurality of processes or steps, such processes or steps may be performed in any order, unless expressly and necessarily limited to a particular order.

FIG. 1 provides a plan view of exemplary multi-channel SAW filter 100. The filter 100 is fabricated on a voltage controlled velocity tunable piezoelectric substrate 101, which is formed typically of electrically insulated Lithium Niobate or GaN on a supported substrate, which is typically made of silicon or silicon carbide. The filter 100 is comprised of an input transducer 102 and an output transducer 111, spaced apart from each other on the surface of the substrate 101.

The input transducer 102 includes a first input electrode 104 and a first output electrode 105, together formed as side elements of the input transducer 102. A plurality of input sub-transducers 103 each extend from a portion of the first input electrode 104 or a portion of the first output electrode 105 on a top side and from a portion of the corresponding opposing electrode on a bottom side. The input sub-transducers 103 are implemented in a variety of ways as known in the art, including as distributed acoustic reflection transducers (DARTs) or as simple tapered interdigital transducers (TIDTs). Each input sub-transducer 103 produces a frequency response with a unique voltage controlled tunable center frequency that is adjusted according to the biasing of the first input electrode 104 and the first output electrodes 105.

The output transducer 111 is constructed similarly to the input transducer 102, and includes a second input electrode 106 and a second output electrode 107, together formed as side elements of the output transducer 111. A plurality of output sub-transducers 108 each extend out of a portion of the second input electrode 106 or a portion of the second output electrode 107 on a top side and from a portion of the corresponding opposing electrode on a bottom side. The output sub-transducers 108 can be implemented in a variety of ways as known in the art, including as DARTs or as TIDTs. Each output sub-transducer 108 produces a frequency response with a unique voltage controlled tunable center frequency that is adjusted according to the biasing of the second input electrode 106 and the second output electrodes 107.

Each set of input and output electrodes 104, 105 and 106, 107 in transducers 102, 111 respectively are arranged as described above so that the plurality of input sub-transducers 103 are electrically and physically connected in parallel and the plurality of output sub-transducers 108 are electrically and physically connected in parallel. It should be noted however that using tilt electrodes 104, 105, 106, 107 (and electrodes 1004, 1005, 1012, and 1013 for the SAW resonator illustrated in FIG. 10) is only one way to electrically connect all parallel channels 115. An air-bridge or wire bonding approach can be used when the SAW reflection from the tilt electrodes is too high, transducer layout permitting.

In the input transducer 102, the plurality of input sub-transducers 103 that are electrically and physically connected in parallel operate to produce a voltage controlled tunable COMB frequency response that is adjusted according to the biasing of the input and output electrodes 104, 105. Similarly, in the output transducer 111, the plurality of output sub-transducers 108 that are electrically and physically connected in parallel operate to produce a voltage controlled tunable COMB frequency response that is adjusted according to the biasing of the input and output electrodes 106, 107. The voltage controlled tunable COMB frequency response of each transducer 102, 111 is the response resulting from the collective frequency responses produced by each of the plurality of input sub-transducers 103 and from the collective responses produced by each of the plurality of output sub-transducers 108, respectively. The voltage controlled tunable COMB frequency responses of transducers 102, 111 are combined to produce a voltage controlled tunable SAW filter response for SAW filter 100.

As shown in FIG. 1, $\lambda 1$-$\lambda 9$ are the wavelengths of each of the plurality of sub-transducers 103 according to the equation ($\lambda$=V/fi) where V is the SAW velocity through an input sub-transducer 103 at zero biasing voltage and fi (i=1, 2, 3 . . . 9) is the center frequency of each input sub-transducer 103. Similarly, $\lambda 1'$-$\lambda 9'$ are the wavelengths of each of the plurality of output sub-transducers 108 according to the equation ($\lambda'$=V'/fi') where V' is the SAW velocity through an output sub-transducer 108 at zero biasing voltage and fi' (i=1, 2, 3 . . . 9) is the center frequency of each output sub-transducer 108.

Each input sub-transducer 103 with a wavelength $\lambda i$ (i=1, 2, 3 . . . 9) forms a channel with each output sub-transducer 108 with a wavelength of $\lambda i'$ (i=1, 2, 3 . . . 9). Multiple channels are formed between corresponding pairs of input sub-transducers 103 and output sub-transducers 108. The number of sub-transducers in both the input transducer and the output transducer 102, 111 are equal; however the number may vary. The center frequency fi (i=1, 2, 3 . . . 9) of each input sub-transducer 103 and the center frequency fi' (i=1, 2, 3 . . . 9) of each output sub-transducer 108 can be arranged in descending order as is shown in FIG. 1; however they can be arranged in any order, including ascending order or multiple combinations of ascending and descending order. In FIG. 1, $\lambda 1 < \lambda 2 < \lambda 3 \ldots < \lambda 9$ and $\lambda 1' < \lambda 2' < \lambda 3' \ldots \lambda 9'$.

There are many advantageous characteristics of a multi-channel transducer such as described herein. The aperture of each channel 115 can be properly designed to control the relative insertion loss of each sub-transducer frequency peak. Further, each input sub-transducer 103 and each output sub-transducer 108 can be designed to have its own transducer finger pattern which results in its own unique frequency response shape.

As can be seen in FIG. 1, SAW filter 100 is tapered. That is, the channels 115 formed across the substrate between the first output electrode 105 and the second input electrode 106 become shorter in the direction of CH 1 to CH 9. The reason that the filter 100 is tapered is because the varying wavelengths of the channel are arranged in ascending wavelength order.

Each channel 115 is associated with a cascaded frequency response produced by cascading the frequency response of each input sub-transducer 103 with center frequency fi and the frequency response of corresponding output sub-transducer 108 with center frequency fi'. In general, except for one channel, $\lambda i \neq \lambda i'$ and $fi \neq fi'$. Center frequencies fi and fi' are purposefully offset to create a cascaded frequency response formed by the input and output transducers 102, 111 with multiple peak frequencies at different pre-determined insertion loss levels upon biasing by different DC voltages, as is described below.

Figure 2:
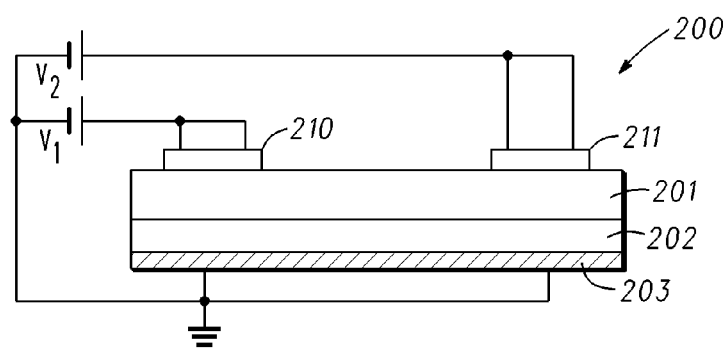
FIG. 2 is an elevation view of a multi-channel SAW filter such as that shown in FIG. 1 and including a voltage source for biasing the multi-channel SAW filter.

FIG. 2 is an elevation view of an exemplary multiple-channel SAW filter 200 with a configuration corresponding generally to that of the SAW filter 100 shown in FIG. 1. An input transducer 210 and an output transducer 211 are formed on a voltage controlled velocity tunable piezoelectric layer 201, which is typically formed over a semiconductor layer 202 of silicon or silicon carbide. A first voltage source V1 provides a direct current (DC) bias to the first input electrode and the first output electrode of the input transducer 202 while a second voltage source V2 provides a second DC bias to the second input electrode and the second output electrode of the output transducer 211. The metalized backside 203 provides the grounding for the voltage sources through the semiconductor layer 202 such that an electric field is created in the piezoelectric layer 201 at both the input transducer 210 and the output transducer 211. As a result of the above described biasing, the mechanical, piezoelectric, and dielectric properties of the piezoelectric layer 201 are changed such that the velocity of the SAW in both the input and output transducers 210, 211 is affected, thereby altering the frequency response of each of the input transducer 210, the output transducer 211, and the center frequency of each of the plurality of input sub-transducers and of the plurality of the output sub-transducers.

Figure 3A:
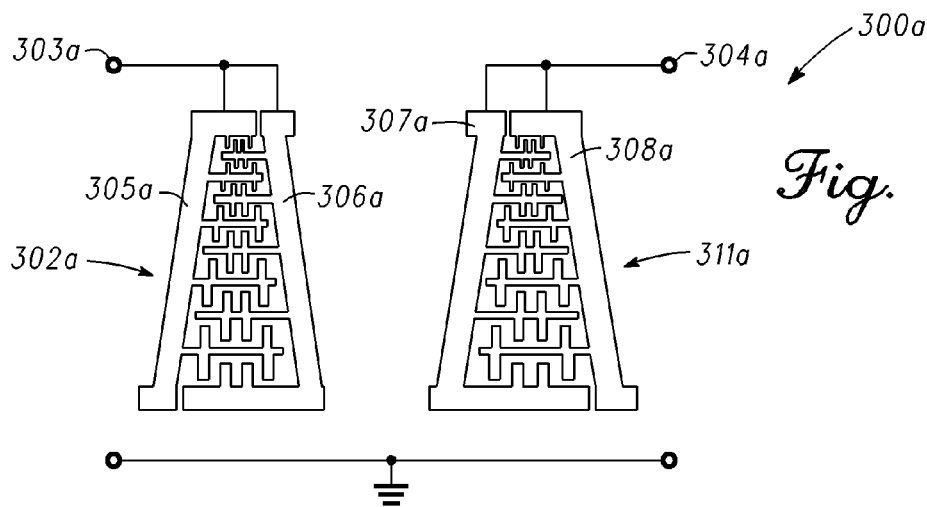
FIG. 3A is a plan view of a first multi-channel SAW filter such as that shown in FIG. 1.

FIG. 3A illustrates a plan view of a first SAW filter 300a that is generally the same type of filter as the above-described SAW filter 100 illustrated in FIG. 1. The first SAW filter 300a comprises a first input transducer 302a and first output transducer 311a formed on a voltage controlled velocity tunable piezoelectric substrate. A first DC voltage source 303a provides a first DC bias to an input electrode 305a and an output electrode 306a of the first input transducer 302a. A second DC voltage source 304a provides a second DC bias to an input electrode 307a and an output electrode 308a of the first output transducer 311a. The first input transducer 302a includes a plurality of sub-transducers electrically and physically connected in parallel and the first output transducer 311a includes a plurality of sub-transducers electrically and physically connected in parallel. A plurality of parallel channels is formed between the first input transducer 302a and the first output transducer 311a.

In the exemplary multi-channel SAW filter 300a, there are nine sub-transducers in both the first input transducer 302a and the first output transducer 311a, and there are nine parallel channels formed between the first input transducer 302a and the first output transducer 311a. The properties of the plurality of sub-transducers of both the first input transducer 302a and the first output transducer 311a, as well as the properties of the parallel channels formed between the first input transducer 302a and the first output transducer 311a are in accord generally with those described above related to SAW filter 100, illustrated in FIG. 1, and are therefore not discussed again presently.

Figure 3B:
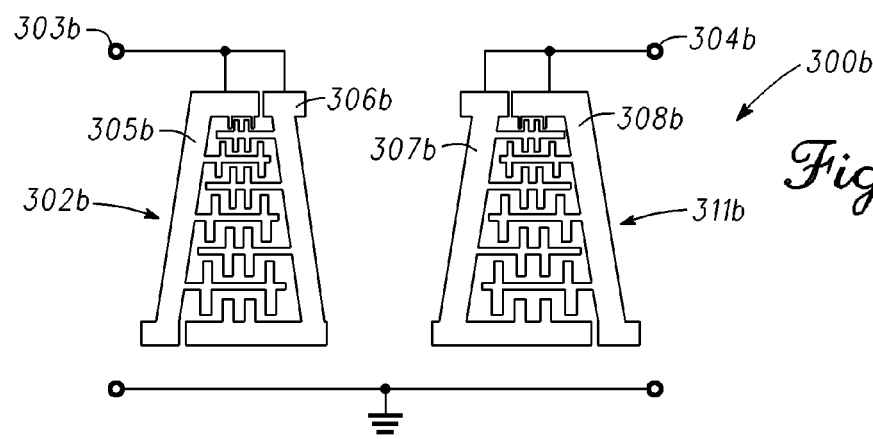
FIG. 3B is a plan view of a second multi-channel SAW filter such as that shown in FIG. 1.

FIG. 3B illustrates a plan view of a second SAW filter 300b that is generally the same type of filter as described above related to SAW filter 100, illustrated in FIG. 1. Second SAW filter 300b comprises a second input transducer 302b and second output transducer 311b formed, on a voltage controlled velocity tunable piezoelectric substrate. A third DC voltage source 303b provides a third DC bias to an input electrode 305b and an output electrode 306b of the second input transducer 302b. A fourth DC voltage source 304b provides a fourth DC bias to an input electrode 307b and an output electrode 308b of the second output transducer 311b.

The second input transducer 302b includes a plurality of sub-transducers electrically and physically connected in parallel and the second output transducer 311b includes a plurality of sub-transducers electrically and physically connected in parallel.

A plurality of parallel channels is formed between the second input transducer 302b and the second output transducer 311b. In the exemplary multi-channel SAW filter 300b, there are seven sub-transducers in both the second input transducer 302b and the second output transducer 311b, and there are seven parallel channels formed between the second input transducer 302b and the second output transducer 311b. The properties of the plurality of sub-transducers of both the second input transducer 302b and the second output transducer 311b, as well as the properties of the parallel channels formed between the first input transducer 302b and the first output transducer 311b are in accord generally with those described above related to SAW filter 100, illustrated in FIG. 1, and are therefore not discussed again presently.

The above discussion indirectly makes the following point, but it should be expressly noted that the number of channels connected in parallel in each of multi-channel SAW filters 300a, 300b can be different. However, the number of channels connected in parallel in each of multi-channel SAW filters 300a, 300b can also be the same.

Figure 3C:
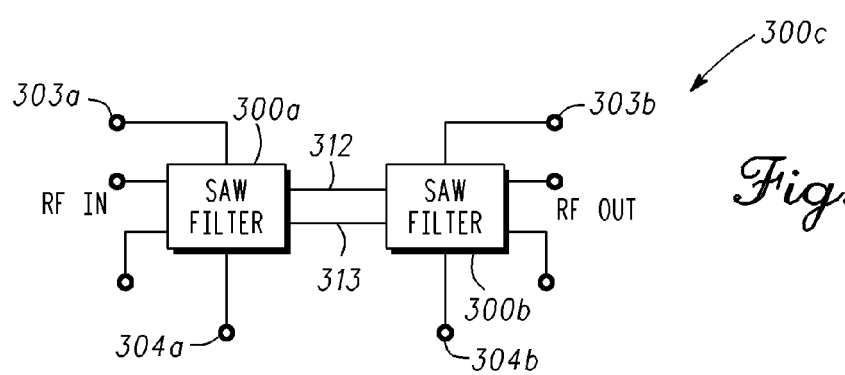
FIG. 3C is a diagram illustrating a SAW filter device comprising the first multi-channel SAW filter of FIG. 3A and the second multi-channel SAW filter of FIG. 3B electrically connected in series.

FIG. 3C is a circuit diagram that illustrates an exemplary SAW filter device 300c comprising SAW filters 300a and 300b electrically connected in series via connection lines 312 and 313. Although the SAW filters 300a, 300b are illustrated as being formed on a single substrate, it is also possible that each of the SAW filters 300A, 300B could be formed on separate substrates of the same type. It should also be noted that in general, an impedance matching circuit consisting of a combination of capacitors, inductors, and/or resistors is needed at the input and output transducers of each of SAW filter 300a, 300b; however these circuits are not shown here for simplicity. First DC voltage source 303a biases the first input transducer 302a and second DC voltage source 304a biases the first output transducer 311a. Third DC voltage source 303b biases the second input transducer 302b and the fourth DC voltage source 304b biases the second output transducer 311b. SAW filters 300a and 300b as described above each produce a voltage controlled tunable frequency response, as discussed above related to exemplary SAW filter 100. However when electrically connected in series as in SAW filter device 300c, an overall SAW is produced that is characterized by a peak frequency of greater rejection than would be produced individually by either of the SAW filters alone. Additionally, the location of the peak frequency of the overall SAW voltage controlled tunable frequency response is adjustable depending on the magnitude of the biasing provided by each of the first through fourth voltage sources, 303a, 304a, 303b, and 304b, respectively.

Figure 4A:
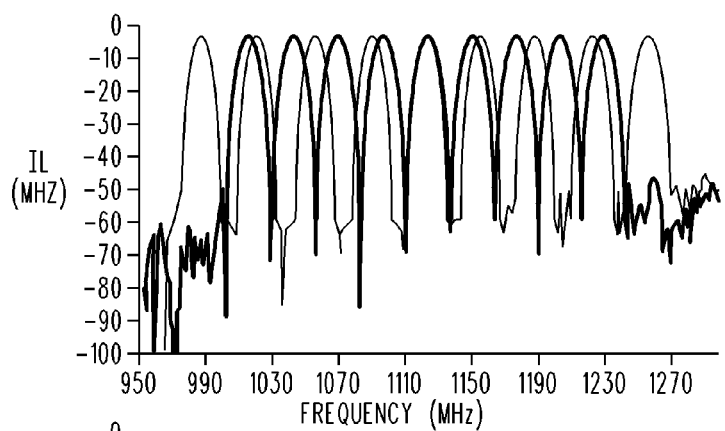
FIG. 4A is a graphical illustration of the individual frequency responses of both an input and output transducer of a first multi-channel SAW filter such as that shown in FIG. 3A.
Figure 4B:
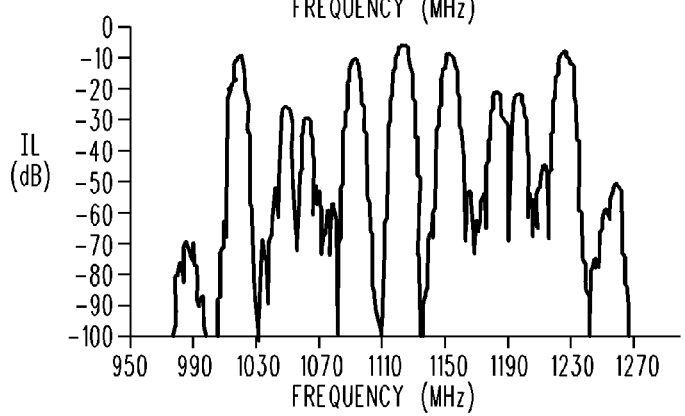
FIG. 4B is a graphical illustration of the combined frequency responses of the input and output transducers shown in FIG. 4A.

FIG. 4A is a graphical illustration of simulated COMB frequency responses of an input transducer and an output transducer of a first SAW filter such as SAW filter 100 of FIG. 1 and/or first SAW filter 300a of FIG. 3A. FIG. 4B illustrates an exemplary SAW filter voltage controlled tunable frequency response that is produced by a SAW filter similar to SAW filter 100 and/or first SAW filter 300a when including the input and output transducers producing the frequency responses illustrated in FIG. 4A.

Figure 4C:
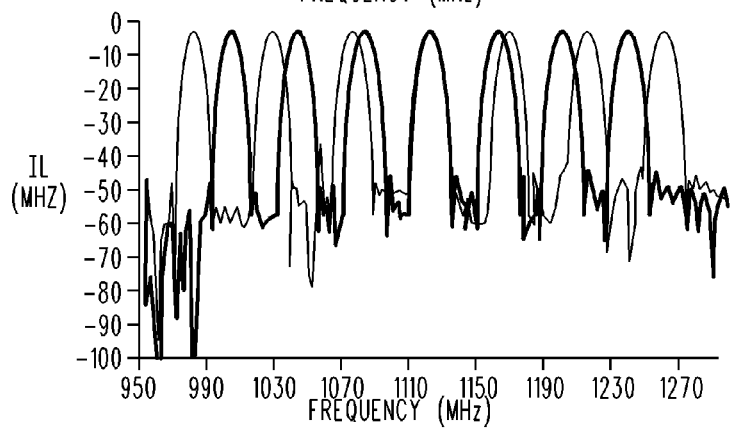
FIG. 4C is a graphical illustration of the individual frequency responses of both an input and output transducer of a second multi-channel SAW filter such as that shown in FIG. 3B.
Figure 4D:
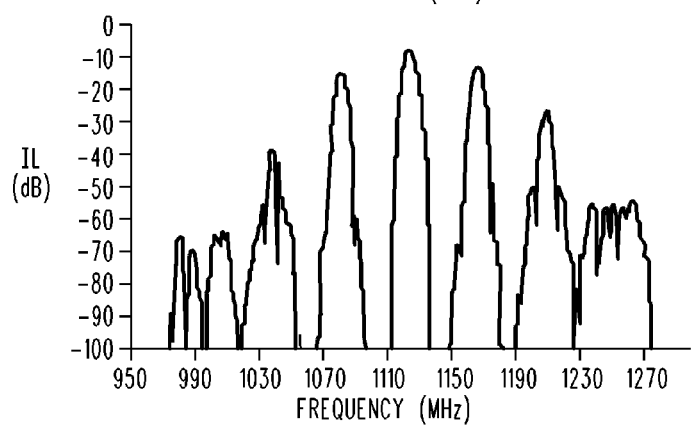
FIG. 4D is a graphical illustration of the combined frequency responses of the input and output transducers shown in FIG. 4C.

FIG. 4C is a graphical illustration of simulated COMB frequency responses of an input transducer and an output transducer of a second SAW filter similar to SAW filter 100 of FIG. 1 and/or second SAW filter 300b of FIG. 3B. FIG. 4D illustrates an exemplary SAW filter voltage controlled tunable frequency response that is produced by a SAW filter similar to SAW filter 100 and/or second SAW filter 300b including the input and output transducers producing the frequency responses illustrated in FIG. 4C.

Figure 5:
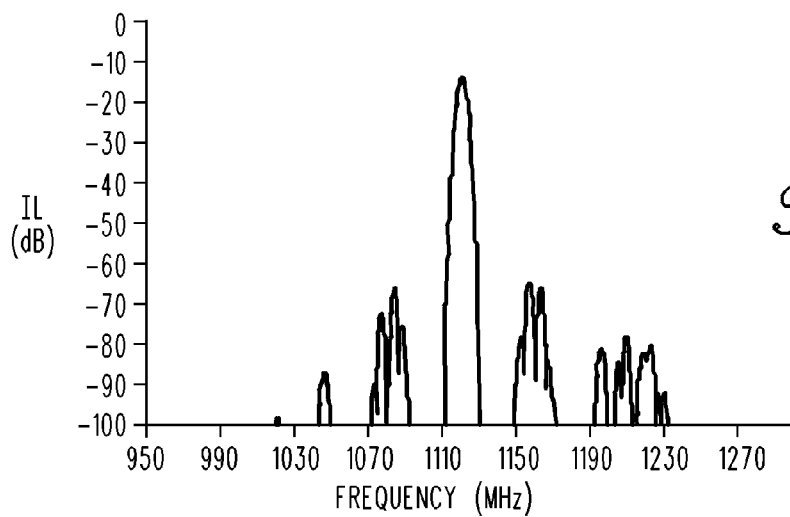
FIG. 5 is a graphical illustration of the combined frequency responses of the frequency responses shown in FIGS. 4B and 4D, and is exemplary of a frequency response of a SAW filter device such as that shown in FIG. 3C where there is no voltage biasing.

FIG. 5 illustrates the combined filter response, including a peak frequency, of the first SAW filter creating the filter response of FIG. 4B and the second SAW filter creating the filter response of FIG. 4D, when the first and second SAW filters are electrically connected in series, similar to the SAW filter device 300c of FIG. 3C. The rejection of the unwanted frequency peaks is much greater in this example than the rejection of the individual SAW filters creating the filter responses of FIGS. 4B, 4D when not combined in series. The location of the peak frequency at approximately 1100-1120 MHz in the frequency band is a result of biasing that is substantially equal by each of the first through fourth voltage sources. The effect is as if there is no biasing at all.

Figure 6A:
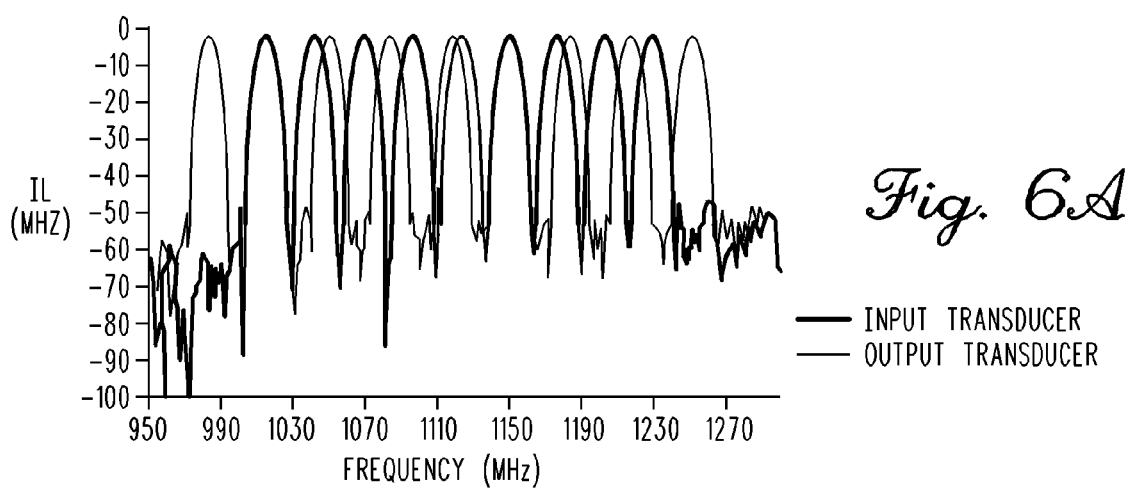
FIG. 6A is a graphical illustration of the individual frequency responses of both an input and output transducer of a first multi-channel SAW filter such as that shown in FIG. 3A.
Figure 6B:
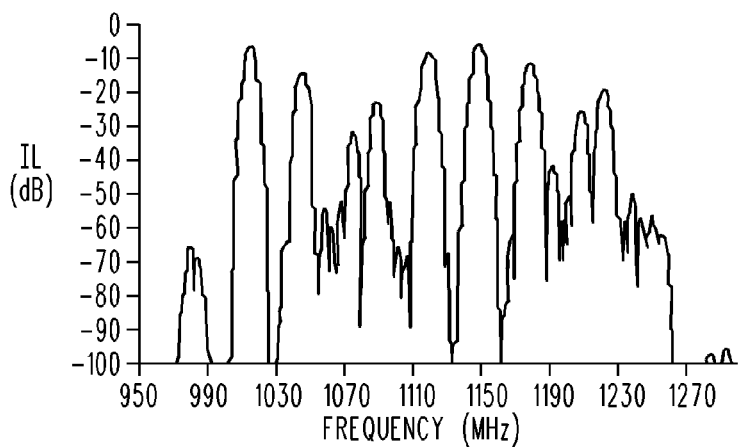
FIG. 6B is a graphical illustration of the combined frequency responses of the input and output transducers shown in FIG. 6A.

FIG. 6A is a graphical illustration of simulated COMB frequency responses of an input transducer and an output transducer of a first SAW filter similar to SAW filter 100 of FIG. 1 and/or first SAW filter 300a of FIG. 3A. FIG. 6B illustrates an exemplary SAW filter voltage controlled tunable frequency response that is produced by a SAW filter similar to SAW filter 100 and/or first SAW filter 300a including the input and output transducers producing the frequency response illustrated in FIG. 6A.

Figure 6C:
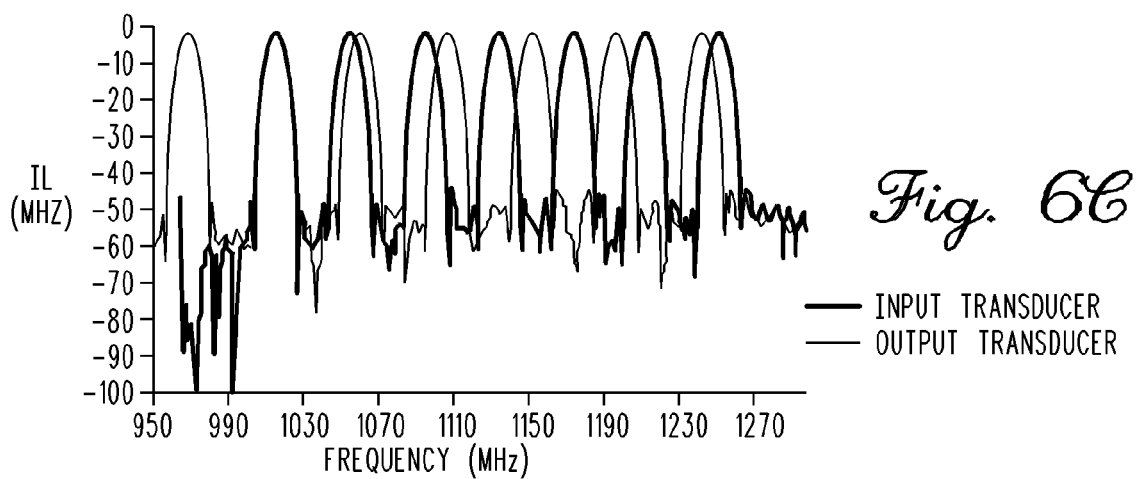
FIG. 6C is a graphical illustration of the individual frequency responses of both an input and output transducer of a second multi-channel SAW filter such as that shown in FIG.
Figure 6D:
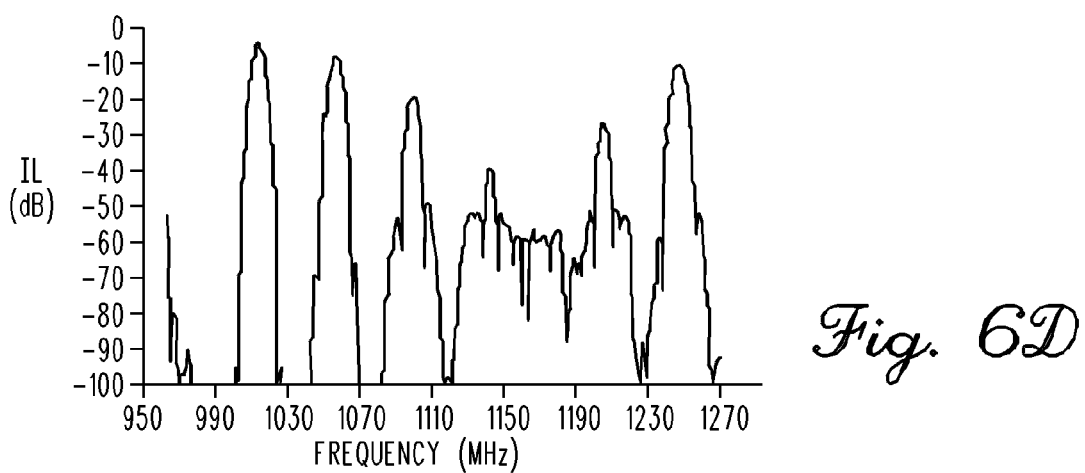
FIG. 6D is a graphical illustration of the combined frequency responses of the input and output transducers shown in FIG. 6C.

FIG. 6C is a graphical illustration of simulated COMB frequency responses of an input transducer and an output transducer of a second SAW filter similar to SAW filter 100 of FIG. 1 and/or second SAW filter 300b of FIG. 3B. FIG. 6D illustrates an exemplary SAW filter voltage controlled tunable frequency response that is produced by SAW filter similar to SAW filter 100 and/or second SAW filter 300b including the input and output transducers producing the frequency response illustrated in FIG. 6C.

Figure 7:
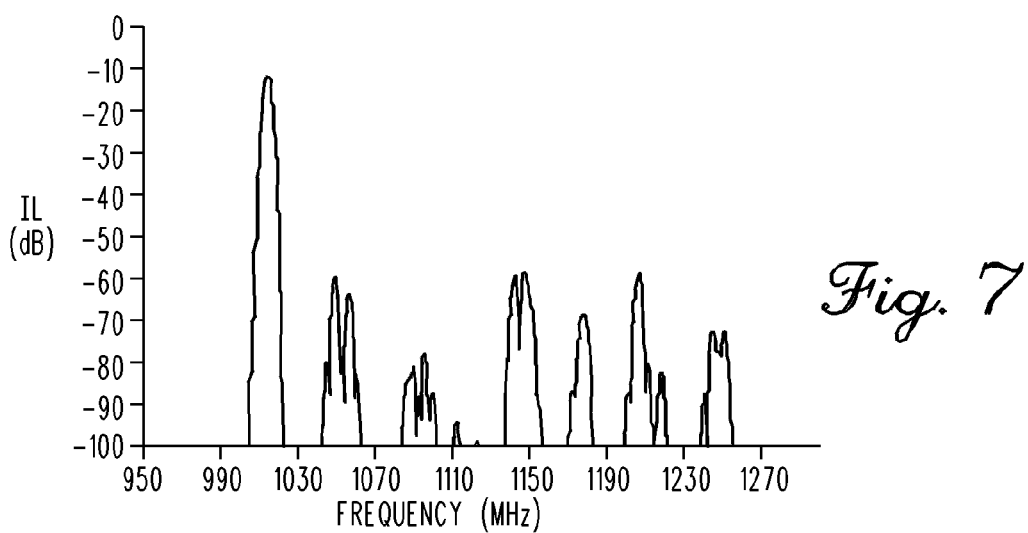
FIG. 7 is a graphical illustration of the combined frequency responses of the frequency responses shown in FIGS. 6B and 6D, and is exemplary of a frequency response of a SAW filter device such as that shown in FIG. 3C where voltage biasing is applied to the input and output transducers of both multi-channel SAW filters.

FIG. 7 illustrates the combined filter response, including the peak frequency, of the first SAW filter creating the filter response of FIG. 6B and the second SAW filter creating the filter response of FIG. 6D, electrically connected in series similar to the SAW filter device 300c of FIG. 3C. The rejection of the peak frequency at approximately 1005-1015 MHz is much greater in this example than the rejection of the individual SAW filters creating the filter responses of 6B, 6D when not combined in series. The location of the peak frequency at approximately 1005-1015 MHz in the frequency band is a result of biasing provided by the first through fourth voltage sources at four different voltages.

Figure 8A:
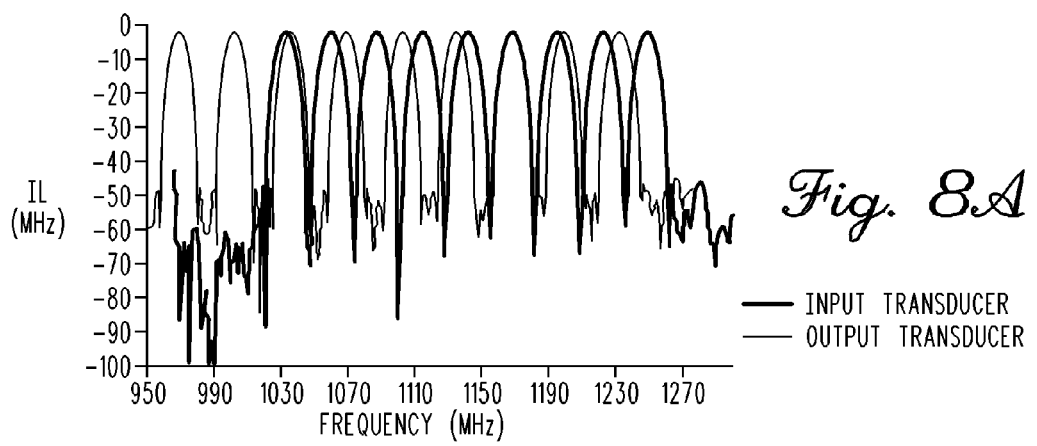
FIG. 8A is a graphical illustration of the individual frequency responses of both an input and output transducer of a first multi-channel SAW filter such as that shown in FIG. 3A.
Figure 8B:
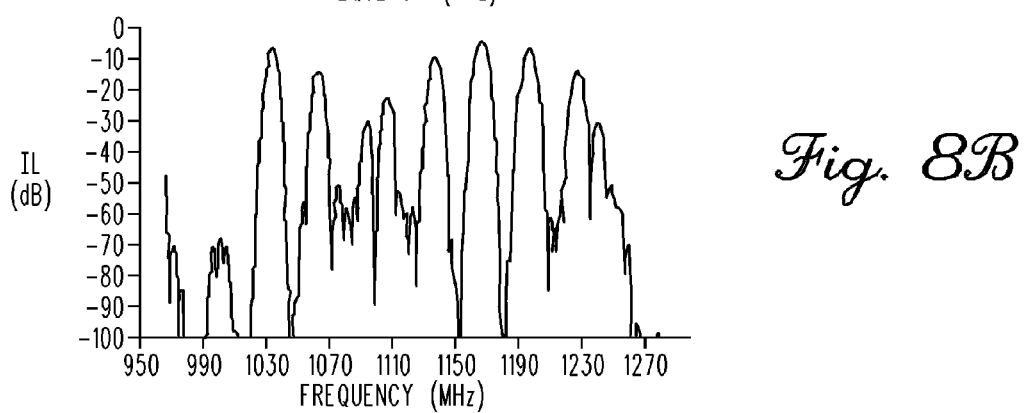
FIG. 8B is a graphical illustration of the combined frequency responses of the input and output transducers shown in FIG. 8A.

FIG. 8A is a graphical illustration of simulated COMB frequency responses of an input transducer and an output transducer of a first SAW filter similar to SAW filter 100 of FIG. 1 and/or first SAW filter 300a of FIG. 3A. FIG. 8B illustrates an exemplary SAW filter voltage controlled tunable frequency response that is produced by SAW filter similar to SAW filter 100 and/or first SAW filter 300a including the input and output transducers producing the frequency response illustrated in FIG. 8A.

Figure 8C:
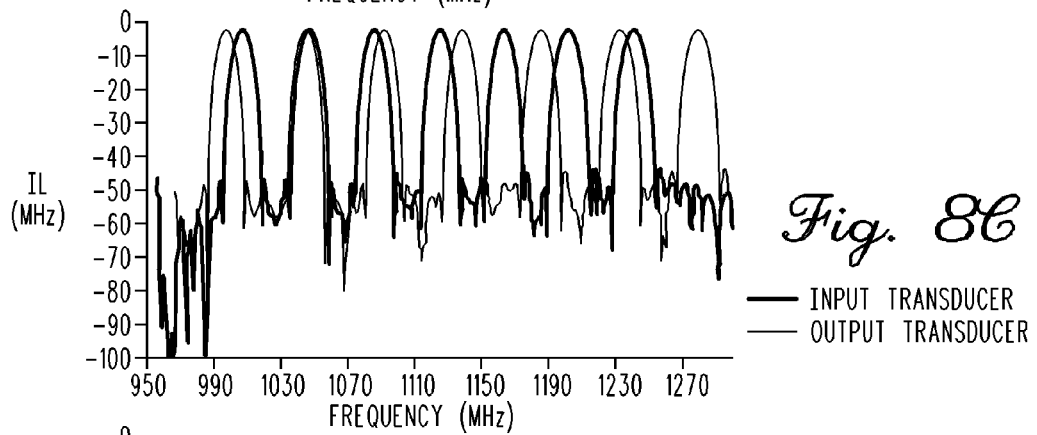
FIG. 8C is a graphical illustration of the individual frequency responses of both an input and output transducer of a second multi-channel SAW filter such as that shown in FIG. 3B.
Figure 8D:
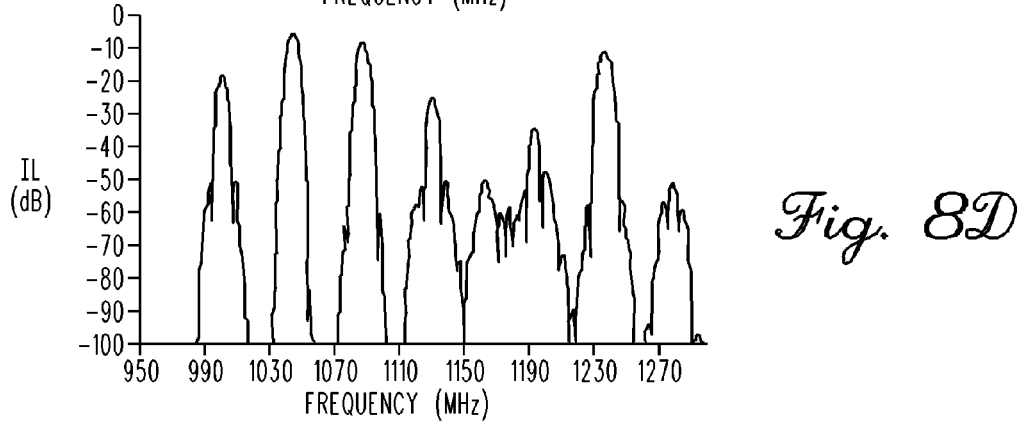
FIG. 8D is a graphical illustration of the combined frequency responses of the input and output transducers shown in FIG. 8C.

FIG. 8C is a graphical illustration of simulated COMB frequency responses of an input transducer and an output transducer of a second SAW filter similar to SAW filter 100 of FIG. 1 and/or second SAW filter 300b of FIG. 3B. FIG. 8D illustrates an exemplary SAW filter voltage controlled tunable frequency response that is produced by SAW filter similar to SAW filter 100 and/or second SAW filter 300b comprising the input and output transducers producing the frequency response illustrated in FIG. 8C.

Figure 9:
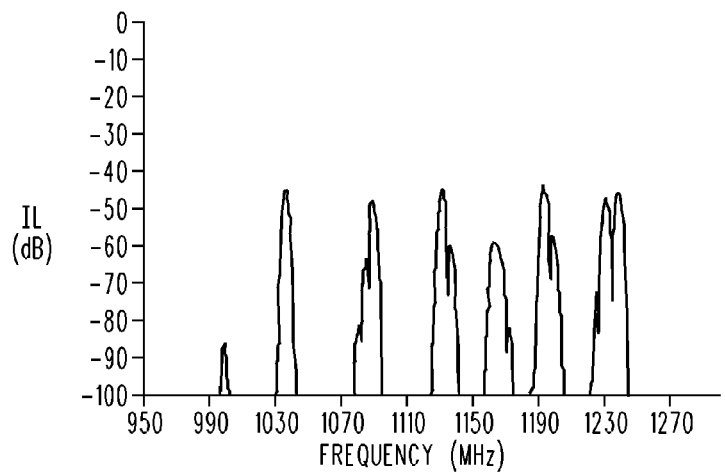
FIG. 9 is a graphical illustration of the combined frequency responses of the frequency responses shown in FIGS. 8B and 8D, and is exemplary of a frequency response of a SAW filter device such as that shown in FIG. 3C where voltage biasing of the input and output transducers of both multi-channel SAW filters is set to an "off" state.

FIG. 9 illustrates the combined filter response of the first SAW filter creating the filter response of FIG. 8B and the second SAW filter creating the filter response of FIG. 8D, electrically connected in series, similar to the SAW filter device 300c of FIG. 3C. In FIG. 9, there is no ascertainable peak frequency possessing great rejection. This is a result of the fact that the first through fourth voltage sources are set to an "off" state. This arrangement is particularly useful for filters arranged in an array as will be discussed below, where certain pairs of filters are off while either a single or multiple pairs are on.

It should be noted that the responses of FIGS. 4A-4D and 5, FIGS. 6A-6D and 7, as well as those of FIGS. 8A-8D and 9 are produced by the same SAW filter device 300c of FIG. 3C. That is to say, FIGS. 5, 7, and 9 demonstrate that by changing the biasing voltages at the first SAW filter (e.g., first SAW filter 300a) and the second SAW filter (e.g., second SAW filter 300b) of SAW filter device 300c, the peak frequency of the cascaded response can move from one end of the frequency window to the other.

Figure 10:
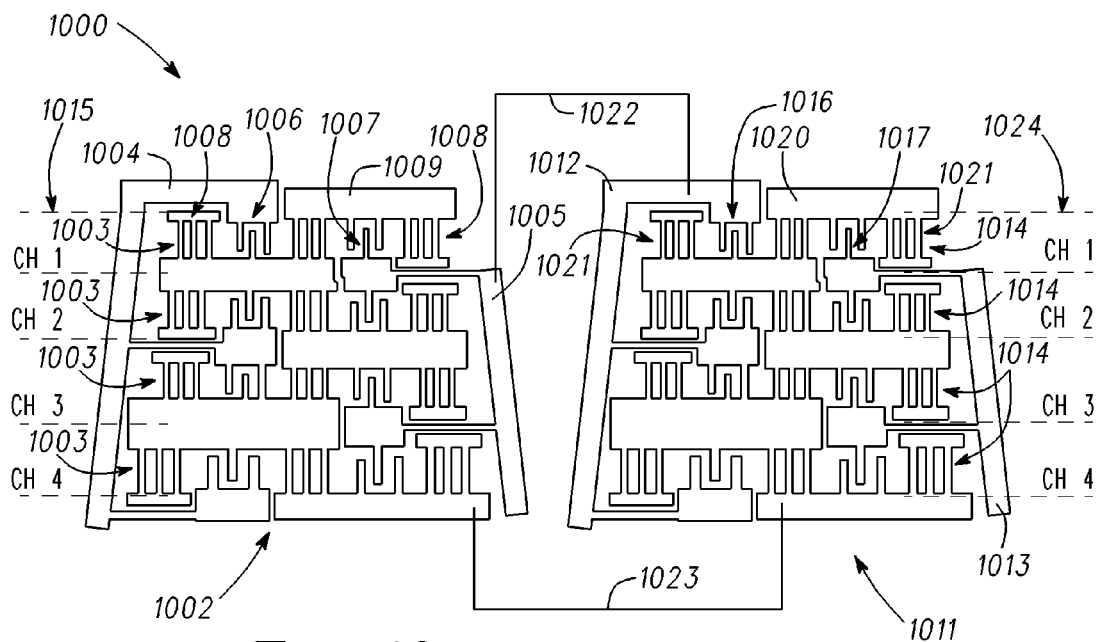
FIG. 10 is a plan view of a multi-channel SAW resonator according to another exemplary embodiment.

FIG. 10 provides a plan view of an exemplary multi-channel SAW resonator 1000. Multi-channel SAW resonator 1000 is fabricated on at least one voltage controlled velocity tunable piezoelectric substrate, which is formed typically of electrically isolated Lithium Niobate or GaN on a supported substrate that is typically of silicon or silicon carbide. The resonator 1000 includes an input resonator 1002 and an output resonator 1011 electrically connected in series to each other through lines 1022 and 1023. The input and output resonators 1002, 1011 can be fabricated on a single voltage controlled velocity tunable piezoelectric substrate or alternatively fabricated on separate substrates of the same type. The input resonator 1002 further includes a first input electrode 1004 and a first output electrode 1005 formed as side elements of the input resonator 1002, and a first grating electrode 1009. Each of a plurality of input sub-resonators 1003 are formed to include an input transducer 1006 connected to the first input electrode 1004, an output transducer 1007 connected to the first output electrode 1005, and a reflection grating structure 1008 connected to the first grating electrode 1009.

The plurality of input sub-resonators 1003 is thus electrically and physically connected in parallel to form multiple channels 1015. It should be noted that the channels 1015 are shown to the left of the first input electrode 1004 for ease of illustration. The channel 1015 formed in each of the plurality of input sub-resonators 1003 actually extends from each input transducer 1006 to each output transducer 1007 and across the reflection grating structure 1008. The nature of the relationship between the wavelengths in the multiple channels 1015 of the input resonator 1002 is similar to that of the multi-channel SAW filter 100 described above, and is not detailed presently. Each input sub-resonator 1003 produces a frequency response with a unique voltage controlled tunable center frequency. The physical effect of the center frequencies is that in any given input sub-resonator 1003, a SAW excited by the input transducer 1006 is constructively reflected at the center frequency by the reflection grating structure 1008 and forms a standing surface acoustic wave within the cavity formed between the input and output transducers 1006, 1007.

The output resonator 1011 is constructed similarly to the input resonator 1002, and includes a second input electrode 1012 and a second output electrode 1013 formed as side elements of the output resonator 1011, and a second grating electrode 1020. Each of a plurality of output sub-resonators 1014 are formed to include an input transducer 1016 connected to a second input electrode 1012, an output transducer 1017 connected to a second output electrode 1013, and a reflection grating structure 1021 connected to the second grating electrode 1020.

The plurality of output sub-resonators 1014 is thus electrically and physically connected in parallel to form the multiple channels 1024. It should be noted that the channels 1024 are shown to the right of the second output electrode 1013 for ease of illustration. The channel 1024 formed in each of the plurality of output sub-resonators 1014 actually extends from each input transducer 1016 to each output transducer 1017 and across the reflection grating structure 1021. The nature of the relationship between the wavelengths in the multiple channels 1024 of the output 1011 is similar to that of the multi-channel SAW filter 100 described above, and is not detailed presently. Each output sub-resonator 1014 produces a frequency response with a unique voltage controlled tunable center frequency. The physical effect of the center frequencies is that in any given output sub-resonator 1014, a SAW excited by the input transducer 1016 is constructively reflected at the center frequency by the reflection grating structure 1021 and forms a standing surface acoustic wave within the cavity formed between the input and output transducers 1016, 1017.

In the input resonator 1002, the plurality of input sub-resonators 1003 are electrically and physically connected in parallel operate to produce a COMB frequency response that is adjusted according to the biasing of the input and output electrodes 1004, 1005 and the first reflection grating electrode 1009. Similarly, in the output resonator 1011, each of the plurality of output sub-resonators 1014 electrically and physically connected in parallel operate to produce a COMB frequency response that is adjusted according to the biasing of the input and output electrodes 1016, 1017 and the second reflection grating electrode 1020. The voltage controlled tunable COMB frequency response of each resonator 1002, 1011 is the response resulting from the collective frequency responses produced by each of the plurality of input sub-resonators 1003 and each of frequency responses produced by each of the plurality of output sub-resonators 1014, respectively.

Resonators 1002, 1011 are electrically connected in series through connection lines 1022 and 1023. In general, there is an impedance matching circuit consisting of a combination of capacitors, inductors, and/or resistors at the input and output transducers 1006, 1007 and 1016, 1017 of the input and output resonator 1002, 1011; however they are not shown for purposes of simplicity. The voltage controlled tunable COMB frequency responses of resonators 1102, 1011 are combined to produce a voltage controlled tunable SAW resonator response for the SAW resonator 1000.

As can be seen in FIG. 10, the first input electrode 1004, the first output electrode 1005, the second input electrode 1012, and the second output electrode 1013 are arranged such that the input and output resonator 1002 and 1011 are tapered, i.e., the multi-channels 1015 and 1024 are shorter in the direction of CH 4 to CH 1. This is due to the differences in wavelengths $\lambda$ of the different channels. It should also be noted that the number of sub-resonators 1003 of the input resonator 1002 forming the multi-channel 1015 and the number of output sub-resonators 1014 of the output resonator 1011 forming the multi-channel 1024 can be different.

Figure 11A:
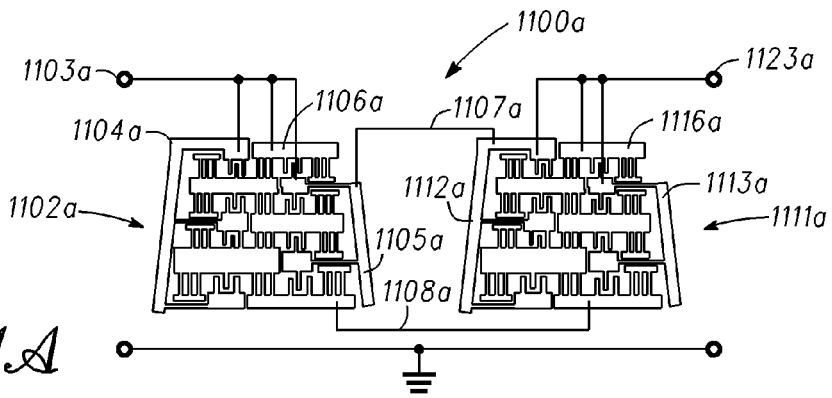
FIG. 11A is a plan view of a first multi-channel SAW resonator such as that shown in FIG. 10.

FIG. 11A illustrates a plan view of a first SAW resonator 1100a that is generally the same type of resonator as the SAW resonator 1000 of FIG. 10. The SAW resonator 1100a comprises a first input resonator 1102a and first output resonator 1111a electrically connected in series by connector lines 1107a and 1108a and formed on at least one voltage controlled velocity tunable piezoelectric substrate. Input resonator 1102a and output resonator 1111a can alternatively be fabricated on separate substrates. A first DC voltage source 1103a provides a first DC bias to the components of the first input resonator 1102a including an input electrode 1104a, an output electrode 1105a, and a first input resonator reflection grating electrode 1106a. A second DC voltage source 1123a provides a second DC bias to the components of the first output resonator 1111a including an input electrode 1112a, an output electrode 1113a, and a first output resonator reflection grating electrode 1116a. It should be noted that both grating electrodes 1106a, 1116a can alternatively be biased separately for greater tuning flexibility.

The first input resonator 1102a includes a plurality of input sub-resonators electrically and physically connected in parallel and the first output resonator 1111a includes a plurality of output sub-resonators electrically and physically connected in parallel. In the exemplary first SAW resonator 1100a, there are four sub-resonators in the first input resonator 1102a and there are four sub-resonators in the first output resonator 1111a. It should be noted that the number of sub-resonators in the first input resonator 1102a and the number of sub-resonators in the first output resonator 1111a can be different. They do not have to be equal as shown in FIG. 11A. The properties of the plurality of sub-resonators of both the first input resonator 1102a and the first output resonator 1111a are in accord generally with those described above related to SAW resonator 1000 of FIG. 10, and are not discussed again presently.

Figure 11B:
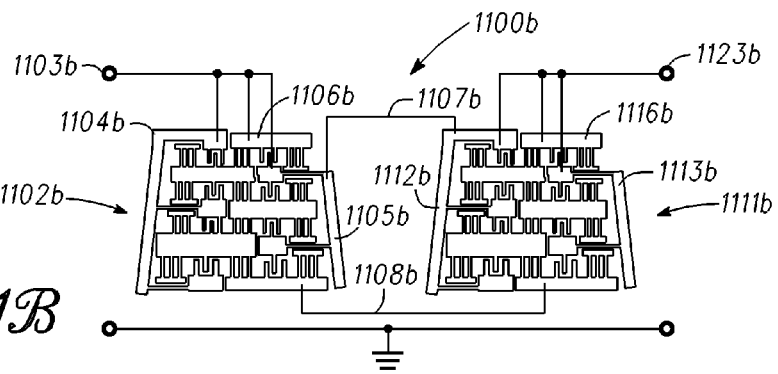
FIG. 11B is a plan view of a second multi-channel SAW resonator such as that shown in FIG. 10.

FIG. 11B illustrates a plan view of a second SAW resonator 1100b that is generally the same type of resonator as described above related to the SAW resonator 1000 of FIG. 10. Second SAW resonator 1100b comprises a second input resonator 1102b and second output resonator 1111b electrically connected in series to each other though lines 1107b and 1108b and formed on at least one voltage controlled velocity tunable piezoelectric substrate. Input resonator 1102b and output resonator 1111b can alternatively be fabricated on separate substrates. A third DC voltage source 1103b provides a third DC bias to the components of the second input resonator 1102b including an input electrode 1104b, an output electrode 1105b, and a second input resonator reflection grating electrode 1106b. A fourth DC voltage source 1123b provides a fourth DC bias to the components of the second output resonator 1111b, including an input electrode 1112b, an output electrode 1113b, and a second output resonator reflection grating electrode 1116b. It should be noted that both grating electrodes 1106b and 1116b can be biased separately for more tuning flexibility.

The second input resonator 1102b includes a plurality of input sub-resonators electrically and physically connected in parallel and the second output resonator 1111b includes a plurality of output sub-resonators electrically and physically connected in parallel. In the exemplary second SAW resonator 1100b, there are four sub-resonators in the second input resonator 1102b and four sub-resonators in the second output resonator 1111b. It should be noted that the number of sub-resonators in the second input resonator 1102b and the number of sub-resonators in the second output resonator 1111b can be different. They do not have to be equal as in FIG. 11B. The properties of the plurality of sub-resonators of both the second input resonator 1102b and the second output resonator 1111b are in accord generally with those described above related to SAW resonator 1000 of FIG. 10, and are not discussed again presently.

Figure 11C:
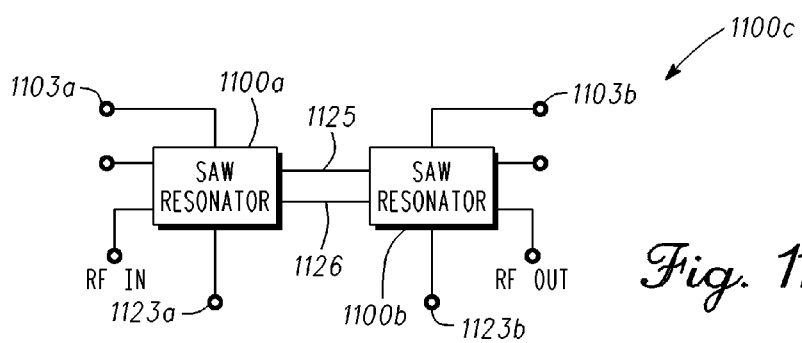
FIG. 11C is a diagram illustrating a SAW filter device comprising the first multi-channel SAW resonator of FIG. 11A and the second multi-channel SAW resonator of FIG. 11B electrically connected in series.

FIG. 11C is a circuit diagram that illustrates an exemplary SAW resonator device 1100c comprising first and second SAW resonators 1100a, 1100b electrically connected in series via connection lines 1125, 1126. It should be noted that in general, an impedance matching circuit consisting of a combination of capacitors, inductors, and/or resistors is needed at the input and output transducers of each of SAW resonators 1100a, 1100b; however these circuits are not shown here for simplicity. First DC voltage source 1103a biases the components of the first input resonator 1102a and the second DC voltage source 1123a biases the components of the first output resonator 1111a. Third DC voltage source 1103b biases the components of the second input resonator 1102b and the fourth DC voltage source 1123b biases the components of the second output resonator 1111b. First and second SAW resonators 1100a and 1100b as described above each produce a voltage controlled tunable frequency response, as discussed above related to exemplary SAW resonator 1000 of FIG. 10. However, when electrically connected in series as in SAW resonator 1100c, an overall SAW voltage controlled tunable frequency response is produced that is characterized by a peak frequency of greater rejection than would be produced individually by either of the first and second SAW resonators 1100a, 1100b alone. Additionally, the location of the peak frequency of the overall SAW voltage controlled tunable frequency response is adjustable depending on the magnitude of the biasing provided by each of the first through fourth voltage sources, 1103a, 1123a, 1103b, and 1123b, respectively.

Figure 12A:
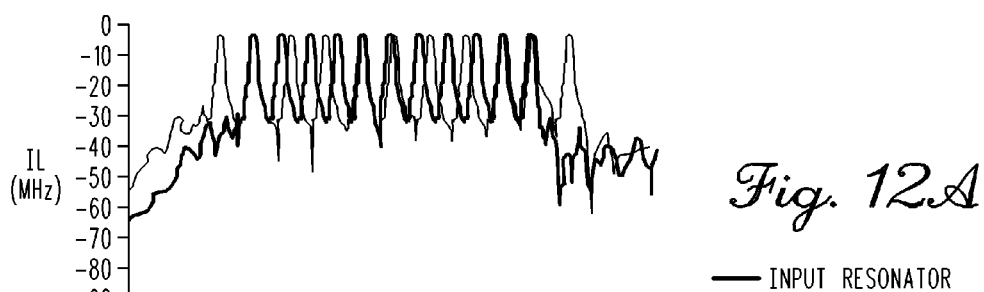
FIG. 12A is a graphical illustration of the individual frequency responses of both an input and output resonator of a first multi-channel SAW resonator filter such as that shown in FIG. 11A.
Figure 12B:
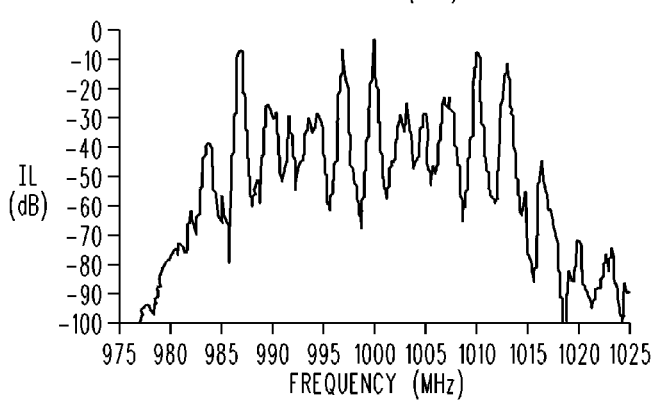
FIG. 12B is a graphical illustration of the combined frequency responses of the input and output resonators shown in FIG. 12A.

FIG. 12A is a graphical illustration of simulated frequency responses of an input resonator and an output resonator of a first SAW resonator similar to SAW resonator 1000 of FIG. 10 and/or first SAW resonator 1100a of FIG. 11A (with the exception that the frequency response reflects eleven sub-resonators rather than four sub-resonators). FIG. 12B illustrates an exemplary SAW resonator voltage controlled tunable frequency response that is produced by a SAW resonator similar to SAW resonator 1000 and/or SAW resonator 1100a including the input and output resonators producing the frequency responses illustrated in FIG. 12A.

Figure 12C:
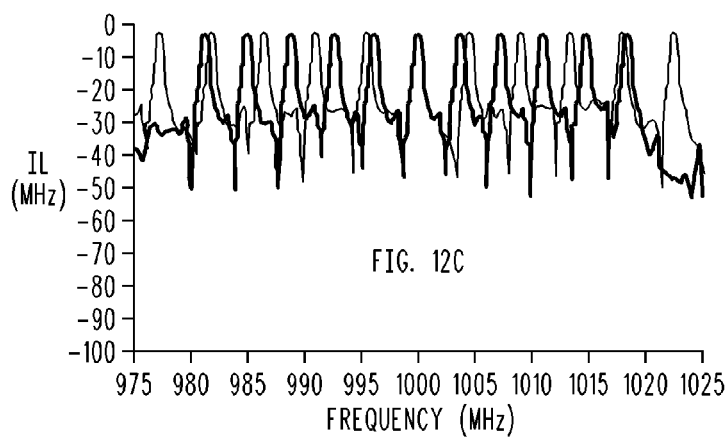
FIG. 12C is a graphical illustration of the individual frequency responses of both an input and output resonator of a second multi-channel SAW resonator such as that shown in FIG. 11B.
Figure 12D:
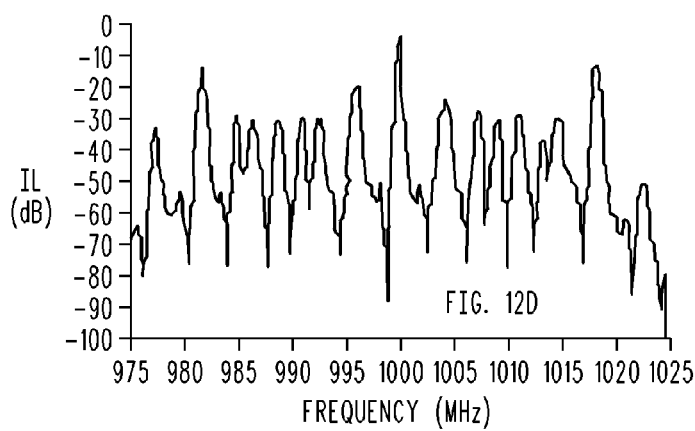
FIG. 12D is a graphical illustration of the combined frequency responses of the input and output transducers shown in FIG. 12C.

FIG. 12C is a graphical illustration of simulated frequency responses of an input resonator and an output resonator of a second SAW resonator similar to SAW resonator 1000 of FIG. 10 and/or SAW resonator 1100b of FIG. 11B (with the exception that the frequency responses reflect eleven sub-resonators rather than four sub-resonators). FIG. 12D illustrates an exemplary SAW resonator voltage controlled tunable frequency response that is produced by a SAW resonator similar to SAW resonator 1000 and/or SAW resonator 1100b including the input and output resonators producing the frequency responses illustrated in FIG. 12C.

Figure 13:
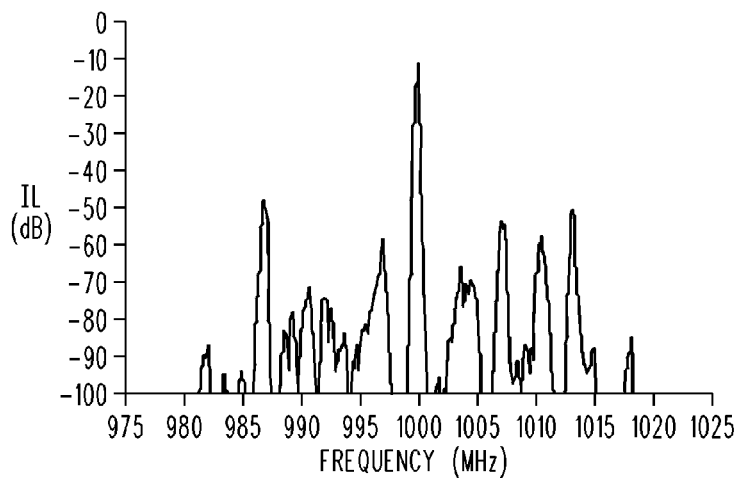
FIG. 13 is a graphical illustration of the combined frequency responses of the frequency responses shown in FIGS. 12B and 12D, and is exemplary of a frequency response of a SAW filter device such as that shown in FIG. 11C where voltage biasing is applied to the input and output resonators of both multi-channel SAW resonators.

FIG. 13 illustrates the combined filter response, including the peak frequency, of the first SAW resonator represented by the graph of FIG. 12B and the second SAW resonator represented by the graph of FIG. 12D electrically connected in series, similar to the SAW resonator device 1100c of FIG. 11. The rejection of the peak frequency at approximately 1000 MHz in this example is much greater than the rejection of the individual SAW resonators creating the filter responses of FIGS. 12B, 12D when not combined in series.

Figure 14:
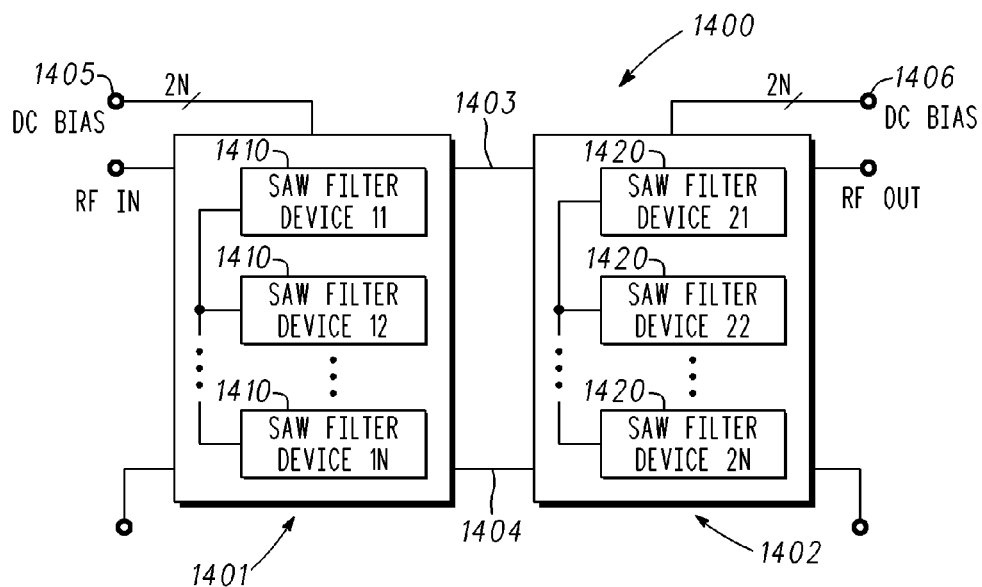
FIG. 14 is a representation of two sub-arrays of SAW filter devices (SAW filters or SAW resonators) electrically connected in series to form an array of SAW filter devices, each sub-array including a plurality of multi-channel SAW filters devices electrically and physically connected in parallel.

FIG. 14 illustrates an array 1400. The array 1400 includes two sub-arrays 1401, 1402. Each of the sub-arrays 1401, 1402 further includes a plurality of SAW filter devices 1410, 1420 respectively. The SAW filter devices 1410, 1420 are either entirely SAW filters similar to the SAW filter 100 of FIG. 1 or SAW resonators similar to the SAW resonator 1000 of FIG. 10. In sub-array 1401, the SAW filter devices 1410 are electrically and physically connected in parallel and in sub-array 1402, the SAW filter devices 1420 are similarly electrically and physically connected in parallel. The sub-arrays 1401, 1402 are further electrically connected in series through connector lines 1403, 1404. In general, an impedance matching circuit consisting of a combination of capacitors, inductors, and/or resistors is needed at the input and output transducers of each of SAW filter device; however these circuits are not shown here for simplicity.

A DC bias is applied to each sub-array 1401, 1402 through DC bias lines 1405, 1406 respectively. DC bias line 1405 is actually an array consisting of 2N bias lines where N is the integer representing the highest number of corresponding SAW filter devices. The bias lines comprising the array in DC bias line 1405 bias the input transducer electrodes and output transducer electrodes in each SAW filter device 11, 12 ... 1N. Similarly, DC bias line 1406 is an array consisting of 2N bias lines that bias the input transducer electrodes and output transducer electrodes in each SAW filter device 21, 22 ... 2N.

Each SAW filter device 1410 in sub-array 1401 corresponds to a SAW filter device 1420 in sub-array 1402. Thus as seen in FIG. 14, SAW filter device 11 in sub-array 1401 corresponds with SAW filter device 21 in sub-array 1402. SAW filter device 12 in sub-array 1401 corresponds with SAW filter device 22 in sub-array 1402. SAW filter device 13 in sub-array 1401 corresponds with SAW filter device 23 in sub-array 1402. This continues such that SAW filter device 1N in sub-array 1401 corresponds with SAW filter device 2N in sub-array 1402, where N is the integer representing the highest number of corresponding SAW filter devices.

Figure 15:
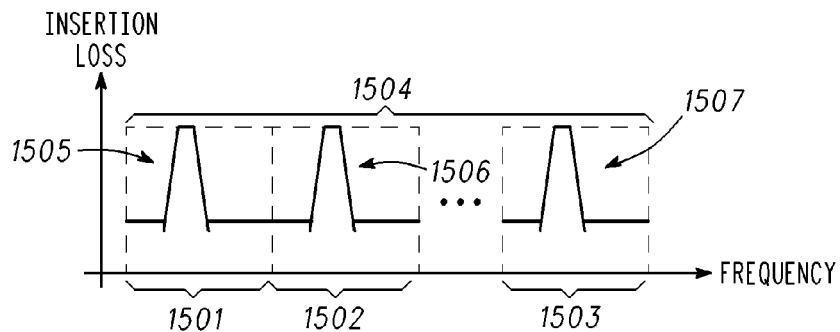
FIG. 15 is a graphical representation of the operating range and peak frequency response of corresponding pairs of multi-channel SAW filter devices derived from two sub-arrays of multi-channel SAW filters devices, the two sub-arrays being electrically connected in series to form an array.

FIG. 15 illustrates the operating range and center or peak frequency of corresponding pairs of SAW filter devices 1410, 1420 of FIG. 14 that are turned on by particular DC biasing. The cascaded response of the pair of SAW filter device 11 and SAW filter device of 21 of FIG. 14 are represented by the operating range 1501 and peak frequency 1505 in FIG. 15. The cascaded response of the pair of SAW filter device 12 and SAW filter device 22 of FIG. 14 are represented by the operating range 1502 and peak frequency 1506 in FIG. 15. The cascaded response of the pair of SAW filter device 1N and SAW filter device 2N of FIG. 14 is represented by the operating range 1503 and peak frequency 1507 in FIG. 15.

The cascaded response of sub-arrays 1401 and 1402 is represented by the overall operating range 1504 which is the sum of all operating ranges from the cascaded responses of each pair of SAW filter devices 1410 and 1420 in the sub-arrays. The positions of the peak frequencies 1505, 1506 ... 1507 of the entire array can be adjusted by applying different biases through DC bias lines 1405 and 1406 of FIG. 14. The tunable range of the array is much larger than any single pair of SAW filter devices simply electrically connected in series. However, it is possible that only one or multiple pairs of corresponding SAW filter devices 1410, 1420 operate at a given time.

Figure 16:
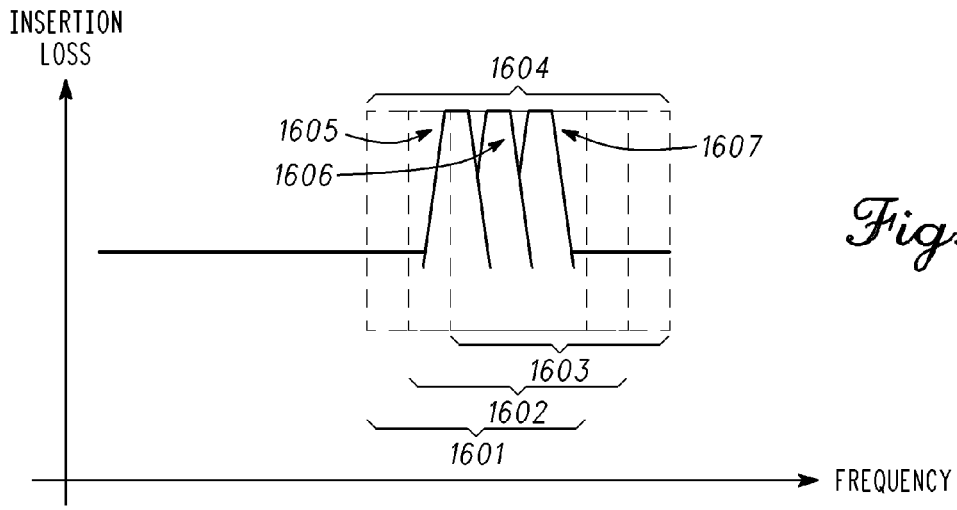
FIG. 16 is a graphical representation of the operating range and peak frequency response of corresponding pairs of multi-channel SAW filter devices derived from two sub-arrays of multi-channel SAW filters devices of alternative design configurations than in FIG. 15. The two sub-arrays are electrically connected in series to form an array.

FIG. 16 illustrates the frequency response of another array 1400 but using SAW filter devices 1410, 1420 with different design configurations than those represented graphically in FIG. 15. The operating ranges of the response of corresponding pairs of SAW filter devices 1410 and 1420 are represented in FIG. 16 by the operating ranges 1601, 1602 ... 1603. The overall operating range is represented by range 1604. As is clear, the operating ranges 1601, 1602 ... 1603 overlap another and the peak frequencies 1605, 1606 ... 1607 similarly overlap. It should be noted that for purposes of simplicity in the drawings, FIG. 14 is illustrated to indicate that there are only three corresponding pairs of SAW filter devices 1410, 1420 in the array 1400. The number of overlapping operating ranges and peak frequencies, however, can be extended to arrays with many more pairs of SAW filter devices 1410, 1420.

Using DC biasing applied through DC bias lines 1405 and 1406 of FIG. 14, a larger peak frequency range can be achieved by overlapping the operating ranges and corresponding peak frequencies. In summary, it is possible to fabricate further arrays 1400 using SAW filter devices 1410, 1420 that are of yet different design configurations that can achieve similar results as illustrated in FIGS. 15 and 16.

Although exemplary embodiments have been depicted and described herein in detail, it will be apparent to those skilled in the relevant art that various modifications, additions, substitutions, and the like can be made that are considered within the scope of the invention as defined in the following claims, presented below.

What is claimed is:

1. A multi-channel surface acoustic wave (SAW) filter, comprising:
a voltage controlled velocity tunable piezoelectric substrate;
an input transducer fabricated on the substrate and including a plurality of input sub-transducers electrically and physically connected in parallel to produce an input transducer voltage controlled tunable COMB frequency response, each input-sub-transducer having a unique voltage controlled tunable center frequency;
an output transducer fabricated on the substrate and including a plurality of output sub-transducers electrically and physically connected in parallel to produce an output transducer voltage controlled tunable COMB frequency response, each output sub-transducer having a unique voltage controlled tunable center frequency; and
a plurality of parallel channels formed by corresponding pairs of the plurality of input sub-transducers and the plurality of output sub-transducers, wherein
the input transducer voltage controlled tunable COMB frequency response and output transducer voltage controlled tunable COMB frequency response are combined to produce an associated SAW filter voltage controlled tunable frequency response.

2. A SAW filter array comprising the multi-channel SAW filter according to claim 1, wherein
the multi-channel SAW filter is one of a plurality of like multi-channel SAW filters electrically and physically connected in parallel to form an input sub-array, the sub-array being electrically cascaded in series with an output sub-array having a configuration corresponding to the input sub-array and a voltage controlled tunable frequency response that is combined with a voltage controlled tunable frequency response of the input sub-array.

3. A SAW filter according to claim 1, wherein
the input transducer includes a first input electrode and a first output electrode, the first input electrode and the first output electrode disposed to electrically and physically connect each of the plurality of input sub-transducers in parallel, and
the output transducer includes a second input electrode and a second output electrode disposed to electrically and physically connect each of the plurality output sub-transducers in parallel.

4. A SAW filter according to claim 3, wherein
the first input electrode, the first output electrode, the second input electrode, and the second output electrode are arranged to provide a tapered configuration that minimizes SAW reflection back to the plurality of parallel channels.

5. A SAW filter according to claim 3, further comprising:

a first direct current (DC) voltage source for applying a first DC bias to the first input electrode and the first output electrode, and a second DC voltage source for applying a second DC bias to the second input electrode and the second output electrode.

6. A multi-channel surface acoustic wave (SAW) resonator, comprising:

at least one voltage controlled velocity tunable piezoelectric substrate;

an input resonator fabricated on one of the at least one voltage controlled velocity tunable piezoelectric substrate including a plurality of input sub-resonators electrically and physically connected in parallel to produce an input resonator voltage controlled tunable COMB frequency response, each of the input sub-resonators including an input transducer, an output transducer, and a reflection grating structure, and having a frequency response with a unique voltage controlled tunable center frequency;

an output resonator fabricated on one of the at least one voltage controlled velocity tunable piezoelectric substrate including a plurality of output sub-resonators electrically and physically connected in parallel to produce an output resonator voltage controlled tunable COMB frequency response, each of the output sub-resonators including an input transducer, an output transducer, and a reflection grating structure, and having a frequency response with a unique voltage controlled tunable center frequency, wherein the input resonator and output resonator are electrically connected in series, and the input resonator voltage controlled tunable COMB frequency response and output resonator voltage controlled tunable COMB frequency response are combined to produce an associated SAW resonator voltage controlled tunable frequency response.

7. A SAW resonator array comprising the multi-channel SAW resonator according to claim 6, wherein the multi-channel SAW resonator is one of a plurality of like multi-channel SAW resonators electrically and physically connected in parallel to form an input sub-array, the input sub-array being electrically cascaded in series with an output sub-array having a configuration corresponding to the input sub-array and a voltage controlled tunable frequency response that is combined with a voltage controlled tunable frequency response of the input sub-array.

8. A SAW resonator according to claim 6, wherein the input resonator further comprises a first reflection grating electrode, a first input electrode and a first output electrode each disposed to electrically and physically connect the plurality of input sub-resonators in parallel, and the output resonator further comprises a second reflection grating electrode, a second input electrode and a second output electrode each disposed to electrically and physically connect the plurality of output sub-resonators in parallel.

9. A SAW resonator according to claim 8, further comprising:

a first direct current (DC) voltage source for applying a first DC bias to the first input electrode, the first output electrode, and the first reflection grating electrode, and a second DC voltage source for applying a second DC bias to the second input electrode, the second output electrode, and the second reflection grating electrode.

10. A surface acoustic wave (SAW) filter device, comprising:

a voltage controlled velocity tunable piezoelectric substrate;

a first SAW filter, including:

a first input transducer fabricated on the substrate and including a plurality of first input sub-transducers electrically and physically connected in parallel to produce a first input transducer voltage controlled tunable COMB frequency response, each first input sub-transducer having a unique voltage controlled tunable center frequency;

a first output transducer fabricated on the substrate and including a plurality of first output sub-transducers electrically and physically connected in parallel to produce a first output transducer voltage controlled tunable COMB frequency response, each first output sub-transducer having a unique voltage controlled tunable center frequency; and a plurality of first parallel channels formed by corresponding pairs of the plurality of first input sub-transducers and the plurality of first output sub-transducers, wherein the first input transducer voltage controlled tunable COMB frequency response and first output transducer voltage controlled tunable COMB frequency response are combined to produce an associated first SAW filter voltage controlled tunable frequency response; and a second SAW filter electrically connected in series to the first SAW filter and including:

a second input transducer fabricated on the substrate and including a plurality of second input sub-transducers electrically and physically connected in parallel to produce a second input transducer voltage controlled tunable COMB frequency response, each second input sub-transducer having a unique voltage controlled tunable center frequency;

a second output transducer fabricated on the substrate and including a plurality of second output sub-transducers electrically and physically connected in parallel to produce a second output transducer voltage controlled tunable COMB frequency response, each second output sub-transducer having a unique voltage controlled tunable center frequency; and a plurality of second parallel channels formed by corresponding pairs of the plurality of second input sub-transducers and the plurality of second output sub-transducers, wherein the second input transducer voltage controlled tunable COMB frequency response and second output transducer voltage controlled tunable COMB frequency response are combined to produce an associated second SAW filter voltage controlled tunable frequency response, and the first SAW filter voltage controlled tunable frequency response and the second SAW filter voltage controlled tunable frequency response are cascaded to produce an overall SAW filter voltage controlled tunable frequency response.

11. A SAW filter device according to claim 10, wherein:
the first input transducer includes an input electrode and an output electrode each disposed to electrically and physically connect each of the plurality of first input sub-transducers in parallel,
the first output transducer includes an input electrode and an output electrode each disposed to electrically and physically connect each of the plurality of first output sub-transducers in parallel;
the second input transducer includes an input electrode and an output electrode each disposed to electrically and physically connect each of the plurality of second input sub-transducers in parallel; and
the second output transducer includes an input electrode and an output electrode each disposed to electrically and physically connect each of the plurality of second output sub-transducers in parallel.

12. A SAW filter device according to claim 11, wherein
the input electrode and the output electrode of the first input transducer and the input electrode and the output electrode of the first output transducer are arranged to provide a tapered configuration that minimizes SAW reflection in the plurality of first parallel channels; and
the input electrode and the output electrode of the second input transducer and the input electrode and the output electrode of the second output transducer are arranged to provide a tapered configuration that minimizes SAW reflection back to the plurality of second parallel channels.

13. A SAW filter device according to claim 11, further comprising:
a first direct current (DC) voltage source for applying a first DC bias to the input electrode of the first input transducer and the output electrode of the first input transducer,
a second DC voltage source for applying a second DC bias to the input electrode of the first output transducer and the output electrode of the first output transducer,
a third DC voltage source for applying a third DC bias to the input electrode of the second input transducer and the output electrode of the second input transducer, and
a fourth DC voltage source for applying a fourth DC bias to the input electrode of the second output transducer and the output electrode of the second output transducer.

14. A SAW filter device according to claim 10, wherein
the overall SAW voltage controlled tunable frequency response produces a greater rejection than that individually produced by either of the first SAW filter voltage controlled tunable frequency response and the second SAW filter voltage controlled tunable frequency response.

15. A surface acoustic wave (SAW) filter device, comprising:
at least one voltage controlled velocity tunable piezoelectric substrate;
a first SAW resonator, comprising:
a first input resonator fabricated on one of the at least one voltage controlled velocity tunable piezoelectric substrate including a plurality of first input sub-resonators electrically and physically connected in parallel to produce a first input resonator voltage controlled tunable COMB frequency response, each of the first input sub-resonators including an input transducer, an output transducer, and a reflection grating structure, and having a frequency response with a unique voltage controlled tunable center frequency;
a first output resonator fabricated on one of the at least one voltage controlled velocity tunable piezoelectric substrate including a plurality of first output sub-resonators electrically and physically connected in parallel to produce a first output resonator voltage controlled tunable COMB frequency response, each of the first output sub-resonators including an input transducer, an output transducer, and a reflection grating structure, and having a frequency response with a unique voltage controlled tunable center frequency; wherein
the first input resonator and the first output resonator are electrically connected in series, and
the first input resonator voltage controlled tunable COMB frequency response and the first output resonator voltage controlled tunable COMB frequency response are combined to produce a first SAW resonator voltage controlled tunable frequency response;
a second SAW resonator electrically connected in series to the first SAW resonator and including:
a second input resonator fabricated on one of the at least one voltage controlled velocity tunable piezoelectric substrate including a plurality of second input sub-resonators electrically and physically connected in parallel to produce a second input resonator voltage controlled tunable COMB frequency response, each of the second input sub-resonators including an input transducer, an output transducer, and a reflection grating structure, and having a frequency response with a unique voltage controlled tunable center frequency;
a second output resonator fabricated on one of the at least one voltage controlled velocity tunable piezoelectric substrate including a plurality of second output sub-resonators electrically and physically connected in parallel to produce a second output resonator voltage controlled tunable COMB frequency response, each of the second output sub-resonators including an input transducer, an output transducer, and a reflection grating structure, and having a frequency response with a unique voltage controlled tunable center frequency; wherein
the second input resonator and the second output resonator are electrically connected in series,
the second input resonator voltage controlled tunable COMB frequency response and the second output resonator voltage controlled tunable COMB frequency response are combined to produce a second SAW resonator voltage controlled tunable frequency response, and
the first SAW resonator voltage controlled tunable frequency response and the second SAW resonator voltage controlled tunable frequency response are cascaded to produce an overall SAW resonator voltage controlled tunable frequency response.

16. A SAW filter device according to claim 15, wherein
the first input resonator includes an input electrode, an output electrode, and a first input resonator reflection grating electrode each disposed to electrically and physically connect each of the plurality of first input sub-resonators in parallel,
the first output resonator includes an input electrode, an output electrode, and a first output resonator reflection grating electrode each disposed to electrically and physically connect each of the plurality of first output sub-resonators in parallel,
the second input resonator includes an input electrode, an output electrode, and a second input resonator reflection grating electrode each disposed to electrically and physically connect each of the plurality of second input sub-resonators in parallel, and the second output resonator includes an input electrode, an output electrode, and a second output resonator reflection grating electrode each disposed to electrically and physically connect each of the plurality of second output sub-resonators in parallel.

17. A SAW filter device according to claim 16, further comprising:

a first direct current (DC) voltage source for applying a first DC bias to the input electrode of the first input resonator, the output electrode of the first input resonator, and the first input resonator reflection grating electrode, a second DC voltage source for applying a second DC bias to the input electrode of the first output resonator, the output electrode of the first output resonator, and the first output resonator reflection grating electrode, a third DC voltage source for applying a third DC bias to the input electrode of the second input resonator, the output electrode of the second input resonator, and the second input resonator reflection grating electrode, and a fourth DC voltage source for applying a fourth DC bias to the input electrode of the second output resonator, the output electrode of the second output resonator, and the second output resonator reflection grating electrode.

18. A SAW filter device according to claim 15, wherein the overall SAW resonator voltage controlled tunable frequency response produces a greater rejection than that individually produced by either of the first SAW resonator voltage controlled tunable frequency response and the second SAW resonator voltage controlled tunable frequency response.

* * * * *